United States Patent
Steiner

(10) Patent No.: US 10,939,559 B2
(45) Date of Patent: Mar. 2, 2021

(54) REMOVING UNWANTED FLUX FROM AN INTEGRATED CIRCUIT PACKAGE

(71) Applicant: Schlage Lock Company LLC, Carmel, IN (US)

(72) Inventor: Russell L. Steiner, St. Helen, MI (US)

(73) Assignee: Schlage Lock Company LLC, Carmel, IN (US)

( * ) Notice: Subject to any disclaimer, the term of this patent is extended or adjusted under 35 U.S.C. 154(b) by 0 days.

(21) Appl. No.: 16/717,583

(22) Filed: Dec. 17, 2019

(65) Prior Publication Data

US 2020/0236793 A1 Jul. 23, 2020

Related U.S. Application Data

(62) Division of application No. 16/135,552, filed on Sep. 19, 2018, now Pat. No. 10,512,167.

(Continued)

(51) Int. Cl.
*B23K 1/00* (2006.01)
*H05K 3/00* (2006.01)
(Continued)

(52) U.S. Cl.
CPC ........... *H05K 3/341* (2013.01); *H05K 1/0201* (2013.01); *H05K 3/303* (2013.01); *H05K 3/3442* (2013.01);
(Continued)

(58) Field of Classification Search
CPC ....... H01L 2924/00; H01L 2924/12042; H01L 2924/351; H01L 2223/667; H01L 2224/04105; H01L 2224/16225; H01L 2224/16227; H01L 2224/18; H01L 2224/32245; H01L 2224/73267; H01L 2224/82039; H01L 2224/82045; H01L 2224/83385; H01L 2224/92244;
(Continued)

(56) References Cited

U.S. PATENT DOCUMENTS 4,658,327 A * 4/1987 Hernandez ............... H01G 2/12
174/551
5,346,861 A * 9/1994 Khandros ........... H01L 21/6836
438/15

(Continued)

*Primary Examiner* — Erin B Saad
(74) *Attorney, Agent, or Firm* — Taft Stettinius & Hollister LLP

(57) ABSTRACT

A surface-mounted integrated circuit (IC) package is disclosed that has unwanted flux removed from surface-mounted IC. A bottom termination component (BTC) includes lands and a thermal pad. The lands provide an electrical connection from the BTC and the thermal pad provides heat transfer from the BTC. The thermal pad includes vias that are configured to remove flux generated from solder applied to the surface-mounted IC as the surface-mounted IC is assembled. A printed circuit board (PCB) is mourned to the BTC and is electrically connected to the BTC via the lands and receives heat transfer from the BTC via the thermal pad and includes a reservoir. The reservoir is configured to pull flux positioned between the lands into the reservoir as the flux is generated from the solder applied to the surface-mounted IC as the BTC is mounted to the PCB and as the surface-mounted IC is assembled.

20 Claims, 10 Drawing Sheets

Related U.S. Application Data

(60) Provisional application No. 62/560,435, filed on Sep. 19, 2017.

(51) Int. Cl.
  *H05K 3/34* (2006.01)
  *H05K 1/02* (2006.01)
  *H05K 3/30* (2006.01)

(52) U.S. Cl.
  CPC ......... *H05K 3/3452* (2013.01); *H05K 1/0206* (2013.01); *H05K 2201/10727* (2013.01); *H05K 2201/10969* (2013.01); *H05K 2203/1178* (2013.01)

(58) Field of Classification Search
  CPC ........... H01L 23/49838; H01L 23/5383; H01L 23/5389; H01L 24/18; H01L 24/19; H01L 24/82; H01L 2924/01006; H01L 2924/01011; H01L 2924/01013; H01L 2924/01015; H01L 2924/01019; H01L 2924/01023; H01L 2924/01024; H01L 2924/01027; H01L 2924/01029; H01L 2924/0103; H01L 2924/01033; H01L 2924/01046; H01L 2924/01047; H01L 2924/01078; H01L 2924/01079; H01L 2924/01082; H01L 2924/01087; H01L 2924/01088; H01L 2924/014; H01L 2924/14; H01L 2924/15153; H01L 2924/19041; H01L 2924/19042; H01L 2924/19043; H01L 2924/3025; H01L 2924/3511; H05K 1/0218; H05K 1/185; H05K 2201/0723; H05K 2201/096; H05K 2201/09709; H05K 2201/10969; H05K 1/023; H05K 1/0231; H05K 1/0233; H05K 1/141; H05K 1/145; H05K 2201/10022; H05K 2201/1003; H05K 2201/10636; H05K 2201/10734; H05K 3/3436; H05K 3/368; B23K 1/00

See application file for complete search history.

(56) References Cited

U.S. PATENT DOCUMENTS

| | | | | |
|---|---|---|---|---|
| 5,729,438 | A * | 3/1998 | Pieper | H05K 1/023 361/760 |
| 6,418,029 | B1 | 7/2002 | McKee et al. | |
| 6,722,557 | B2 * | 4/2004 | Tanaka | H01L 24/11 228/207 |
| 8,735,218 | B2 * | 5/2014 | Mueller | H01L 24/83 438/107 |
| 9,224,678 | B2 * | 12/2015 | Chen | H01L 23/49811 |
| 10,334,756 | B1 * | 6/2019 | Dede | H05K 7/20909 |
| 2002/0041489 | A1 * | 4/2002 | Fritz | H01L 23/49827 361/767 |
| 2009/0188703 | A1 | 7/2009 | Ito et al. | |
| 2017/0092565 | A1 * | 3/2017 | Chen | F28F 3/12 |
| 2019/0341908 | A1 * | 11/2019 | Kawamori | H03H 9/215 |

* cited by examiner

REMOVING UNWANTED FLUX FROM AN INTEGRATED CIRCUIT PACKAGE

CROSS-REFERENCE TO RELATED APPLICATIONS

The present application is a divisional of U.S. patent application Ser. No. 16/135,552 filed Sep. 19, 2018 and issued as U.S. Pat. No. 10,512,167, which claims the benefit of U.S. Provisional Application No. 62/560,435 filed Sep. 19, 2017, the contents of each application incorporated herein by reference in their entirety.

BACKGROUND

The present disclosure relates generally to surface-mounted integrated circuit (IC) packages and specifically to removing unwanted flux from IC packages.

Conventional bottom termination components (BTC) packages having lands positioned along the bottom surface of the BTC packages lowers the risk of damage to the lands as compared to the exposed pins, terminals, and/or wire leads of conventional packages. Further, the conventional BTC packages having lands positioned along the bottom surface of the BTC packages also enables an increased PCB design density where an increased quantity of BTC packages may be positioned on a single PCB as the BTC packages may be positioned closer together due to the BTC packages having lands positioned along the bottom surface of the BTC packages, as opposed to pins, terminals, and/or wire leads extending further out from the perimeter of conventional packages.

However, conventional BTC packages also have traits that may result in an increased amount of flux residue that remains after the conventional BTC package is mounted to the PCB. The short die to PCB path results in a decreased space between the conventional BTC package and the PCB which hinders the amount of unwanted flux residue that is flushed out from between the conventional BTC package and the PCB. The soldering of the thermal pad to the PCB results in voids that are difficult to avoid. Thus, unwanted flux residues remain after the conventional BTC package is mounted to the PCB if not addressed.

Current leakage unnecessarily drains the battery life of the system. Lower signal-to-surface insulation resistance (SIR) values indicate undesired paths for current leakage that results in unnecessary battery drain. Unwanted flux residues that remain on the conventional BTC packages after being mounted to the PCBs included in the system create opportunities for electro-chemical migration, dendritic growth, and/or corrosion and thus provides an increased opportunity of current leakage that unnecessarily drains the battery life of the battery source of the system. Thus, eliminating unwanted flux residue during the mounting of the conventional BTC package to the PCB is critical in decreasing current leakage that may unnecessarily drain the battery life of the battery source of the system.

BRIEF SUMMARY

Embodiments of the present disclosure relate to surface mounting an integrated circuit (IC) package with bottom termination components (BTCs) onto a printed circuit board (PCB) and in doing so removing unwanted flux from the assembled IC. In an embodiment, a surface-mounted integrated circuit (IC) package includes at least one bottom termination component (BTC) that includes a plurality of lands and a thermal pad. The plurality of lands provides an electrical connection from the BTC and the thermal pad provides heat transfer from the BTC and the thermal pad includes a plurality of vias that is configured to remove flux generated from solder applied to the surface-mounted IC as the surface-mounted IC is assembled. A printed circuit board (PCB) is mounted to the BTC and is electrically connected to the BTC via the plurality of lands and receives the heat transfer from the BTC via the thermal pad and includes at least one reservoir. The at least one reservoir is configured to pull flux positioned between the plurality of lands into the at least one reservoir as the flux is generated from the solder applied to the surface-mounted IC as the BTC is mounted to the PCB as the surface-mounted IC is assembled.

In one embodiment, a method removes flux generated from solder is applied to a surface-mounted integrated circuit (IC) as the surface-mounted IC is assembled. At least one bottom termination component (BTC) is mounted that includes a plurality of lands and a thermal pad to a printed circuit board (BTC) that includes at least one reservoir. An electrical connection between the BTC and the PCB is provided via the plurality of lands. Heat transfer from the BTC to the PCB is provided via the thermal pad. The thermal pad includes a plurality of vias. Flux generated from the solder applied to the surface-mounted ITC is removed as the surface-mounted IC is assembled via the plurality of vias included in the thermal pad. Flux positioned between the plurality of lands is pulled into the at least one reservoir as the flux is generated from the solder applied to the surface-mounted IC as the surface-mounted IC is assembled.

In another embodiment, a surface-mounted integrated circuit (IC) package includes at least one bottom termination component (BTC) that includes a thermal pad that provides heat transfer from the BTC. The thermal pad includes a plurality of vias that is configured to remove flux generated from solder applied to the surface-mounted IC as the surface-mounted IC is assembled. A printed circuit board (PCB) is mounted to the BTC and receives the heat transfer from the BTC via the thermal pad. A plurality of lands with each land including a peripheral terminal that is electrically connected to a corresponding terminal from the plurality of terminals associated with the BTC and a trace that extends from the corresponding peripheral terminal and extends beyond a solder mask that is applied to the surface-mounted IC package. Each trace is connected to a corresponding peripheral terminal and is configured to prevent the BTC from tilting as the BTC is mounted PCB.

In another embodiment, a system controls an access control device via a controller incorporated into a surface-mounted integrated circuit (IC) package. An access control device is configured to execute an action to regulate access to a space. At least one component associated with the access control device is configured to detect data associated with activity involving access to the space. A controller is configured to instruct the access control device to execute the action based on the data detected by the at least one component to regulate the space. The controller includes at least one bottom termination component (BTC) that includes a plurality of lands and a thermal pad. The plurality of lands provides an electrical connection from the BTC and the thermal pad provides heat transfer from the BTC. The thermal pad includes a plurality of vias that is configured to remove flux generated from solder applied to the surface-mounted IC as the surface-mounted IC is assembled. A printed circuit board (PCB) is mounted to the BTC and is electrically connected to the BTC via the plurality of lands and receives the heat transfer from the BTC via the thermal pad and includes at least one reservoir. The at least one reservoir is configured to pull flux positioned between the plurality of lands into the at least one reservoir as the flux is generated from the solder applied to the surface-mounted IC as the BTC is mounted to the PCB as the surface-mounted IC is assembled.

BRIEF DESCRIPTION OF THE DRAWINGS/FIGURES

Embodiments of the present disclosure are described with reference to the accompanying drawings. In the drawings, like reference numerals indicate identical or functionally similar elements. Additionally, the left most digit(s) of a reference number typically identifies the drawing in which the reference number first appears.

Figure 6:
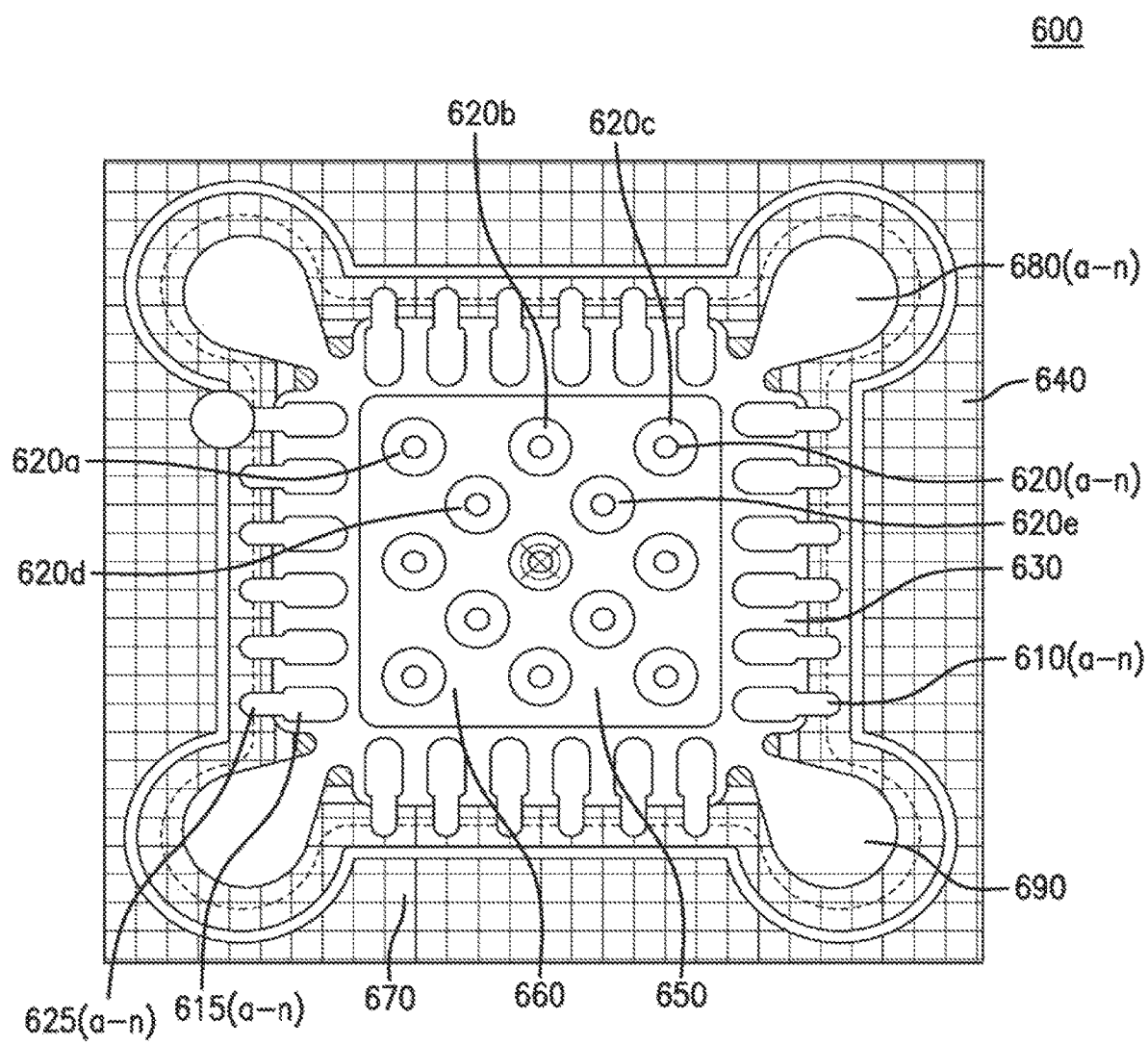
FIG. 6 is a top-elevational view of a BTC package configuration that reduces flux residue of the BTC package according to an exemplary embodiment of the present disclosure.
Figure 9:
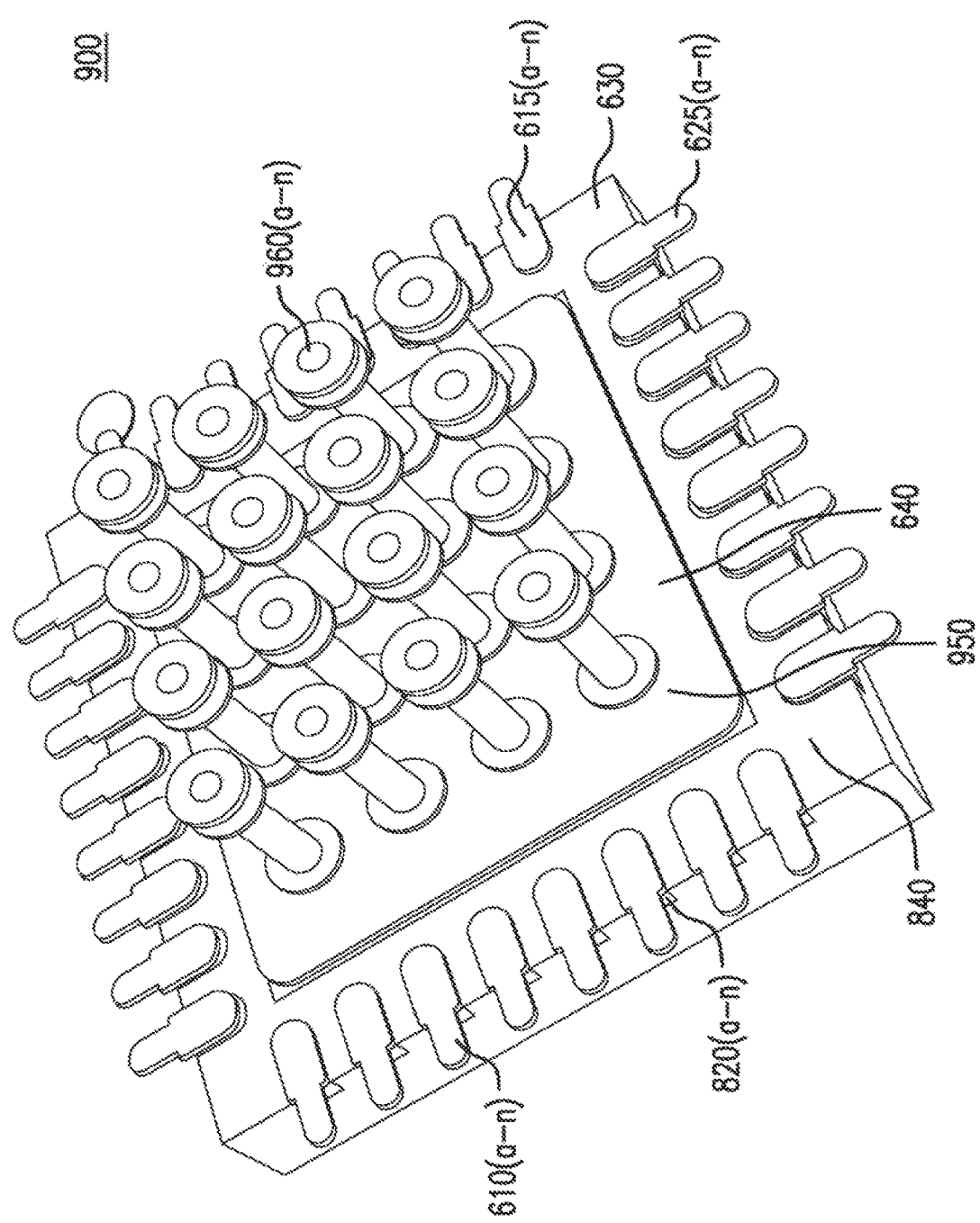
Figure 10:
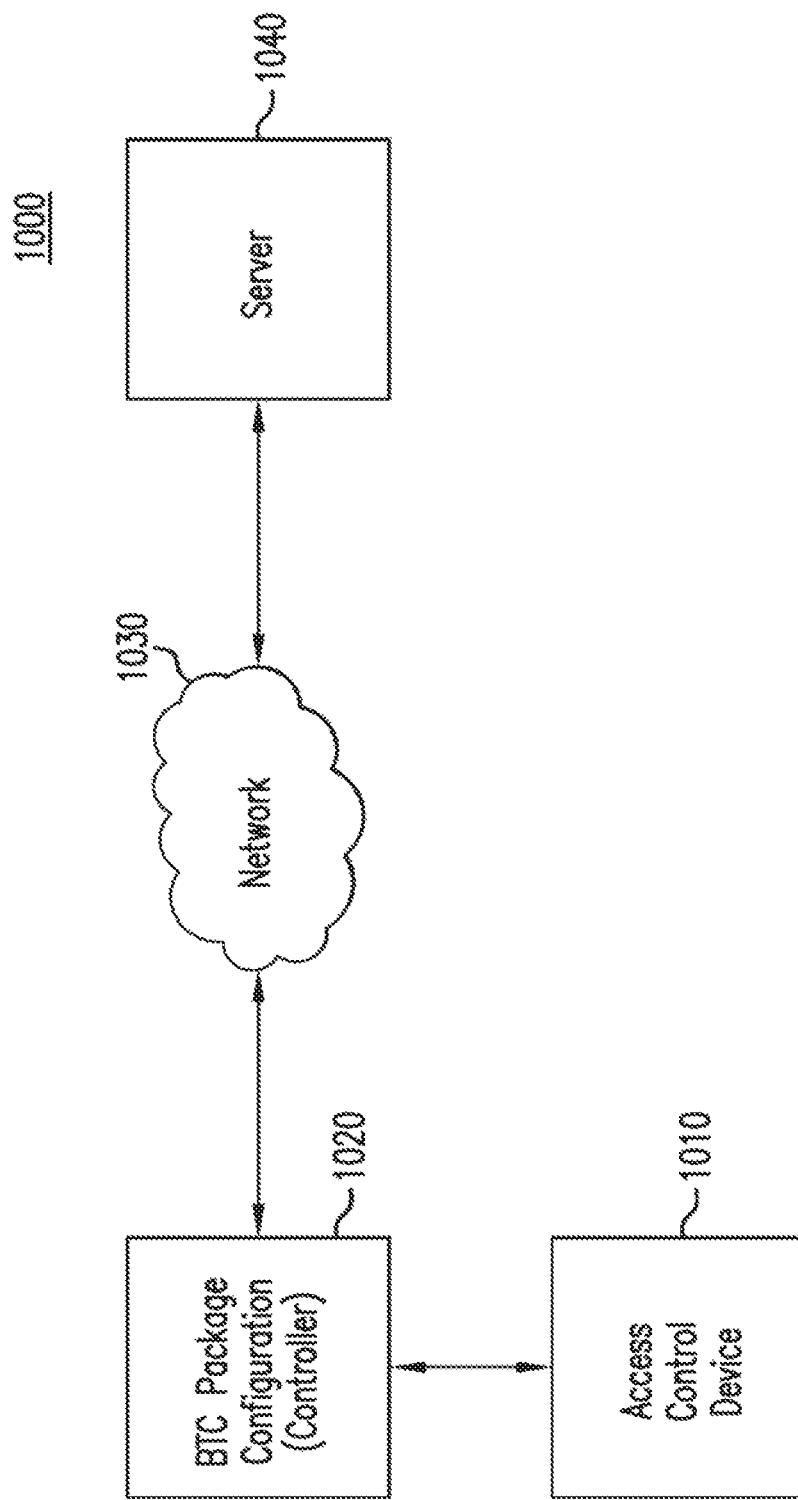

FIG. 9 is a block diagram of another exemplary BTC package configuration and provides a three-dimensional view of the exemplary BTC package configuration depicted in FIG. 6 according to an exemplary embodiment of the present disclosure; and FIG. 10 is a block diagram of an exemplary access device configuration that incorporates the BTC package configurations according to an exemplary embodiment of the present disclosure.

DETAILED DESCRIPTION OF THE PRESENT DISCLOSURE

The following Detailed Description refers to accompanying drawings to illustrate exemplary embodiments consistent with the present disclosure. References in the Detailed Description to "one exemplary embodiment," an "exemplary embodiment," an "example exemplary embodiment," etc., indicate the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic may be described in connection with an exemplary embodiment, it is within the knowledge of those skilled in the art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present disclosure. Therefore, the Detailed Description is not meant to limit the present disclosure. Rather, the scope of the present disclosure is defined only in accordance with the following claims and their equivalents.

Embodiments of the present disclosure may be implemented in hardware, firmware, software, or any combination thereof. Embodiments of the present disclosure may also be implemented as instructions applied by a machine-readable medium, which may be read and executed by one or more processors. A machine-readable medium may include any mechanism for storing or transmitting information in a form readable by a machine (e.g., a computing device). For example, a machine-readable medium may include read only memory ("ROM"), random access memory ("RAM"), magnetic disk storage media, optical storage media, flash memory devices, electrical optical, acoustical or other forms of propagated signals (e.g., carrier waves, infrared signals, digital signals, etc.), and others. Further firmware, software routines, and instructions may be described herein as performing certain actions. However, it should be appreciated that such descriptions are merely for convenience and that such actions in fact result from computing devices, processors, controllers, or other devices executing the firmware, software, routines, instructions, etc.

For purposes of this discussion, each of the various components discussed may be considered a module, and the term "module" shall be understood to include at least one software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently from any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the spirit and scope of the present disclosure. Therefore, such adaptations and modifications are intended to be within the meaning and plurality of equivalents of the exemplary embodiments based upon the teaching and guidance presented herein. It is to be understood that the phraseology or terminology herein for the purpose of description and not of limitation, such that the terminology or phraseology of the present specification is to be interpreted by those skilled in the relevant art(s) in light of the teachings herein.

Conventional Approaches to Mounting BTC Packages to a PCB

Figure 1:
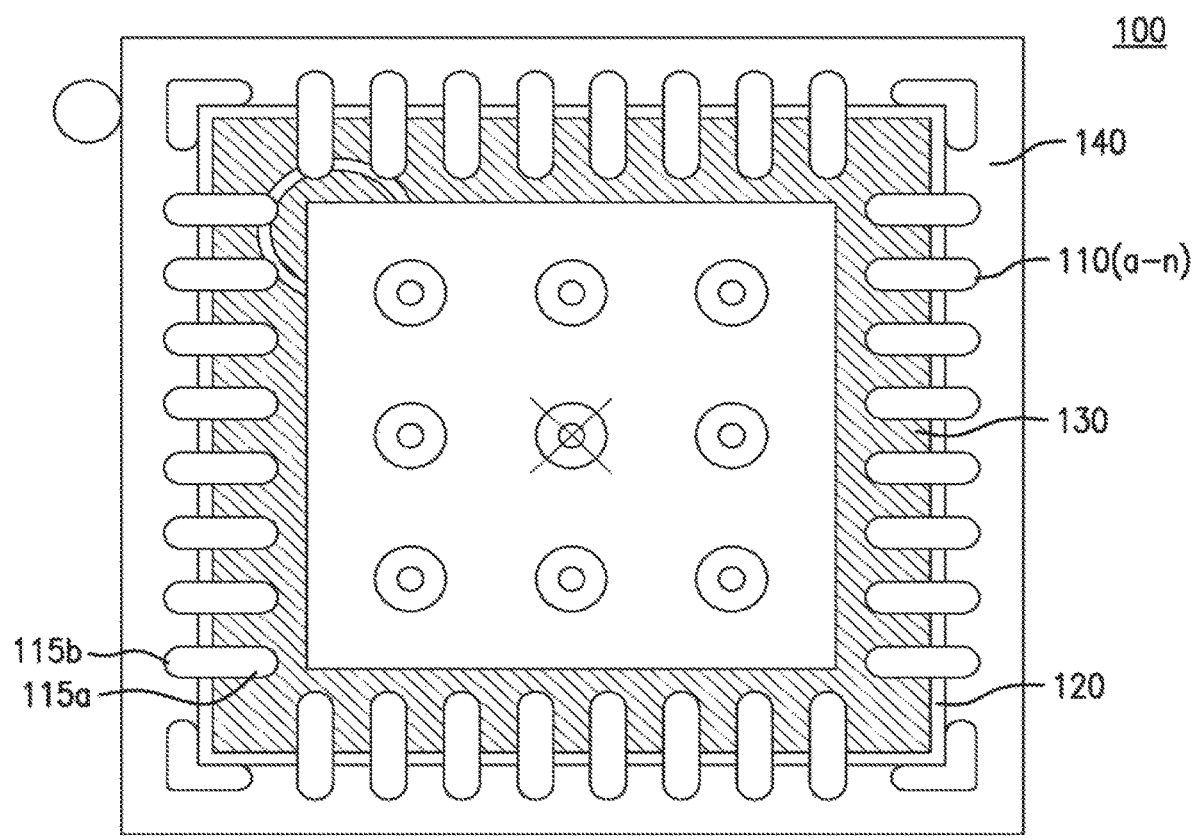
FIG. 1 is a top-elevational view of a conventional QFN package configuration based on the IPC-7351 standard.

FIG. 1 illustrates a top-elevational view of a conventional QFN package configuration 100 based on the IPC-7351 standard. In a conventional approach, a user may enter the dimensions of the conventional QFN package that the user requests and the IPC-7351 standard may then generate the conventional QFN package configuration 100 based on the dimensions entered by the user and the requirements provided under the IPC-7351 standard. The conventional QFN package configuration 100 includes a plurality of conventional lands 110($a$-$n$), where n is an integer equal to or greater than one, and is based on the dimensions of the conventional QFN package that the user requests and the requirements provided under the IPC-7351 standard.

The conventional lands 110($a$-$n$) have rounded edges and are a single structure in that each of the conventional lands 110($a$-$n$) simply include the rounded edged structure that protrude under the conventional QFN package 130 as well as beyond the boundary 120 of the conventional QFN package 130. For example, the conventional land 110$a$ includes a first portion 115$a$ that protrudes under the conventional QFN package 130 as well as the second portion 115$b$ that protrudes well beyond the boundary 120 of the conventional QFN package 130. However, both the first portion 115$a$ and the second portion 115$b$ are part of the same conventional land 110$a$ with simply the first portion 115$a$ positioned under the conventional QFN package 130 and the second portion 115$b$ protruding well beyond the boundary 120 of the conventional QFN package 130. Further the dimensions of the first portion 115$a$ of the conventional land 110$a$ that protrudes under the conventional QFN package 130 fails to match the dimensions of the corresponding terminal (not shown) of the conventional QFN package 130. Similarly, each of the dimensions of the first portions for each of the corresponding conventional lands 110($b$-$n$) also fail to match the dimensions of the corresponding terminals (not shown) of the conventional QFN package 130.

In applying solder to each of the conventional lands 110($a$-$n$) to electrically connect each of the corresponding terminals to each of the conventional lands 110($a$-$n$) in order to electrically connect the conventional QFN package 130 to the conventional PCB 140, an immense amount of flux residue generated from the solder application may result in between the conventional QFN package 130 and the conventional PCB 140 as well as around the QFN package 130. Such excess flux residue may provide an increased risk in electro-chemical migration, dendritic growth, and/or corrosion and thus providing an increased opportunity of current leakage.

Further, the second portion 115$b$ of the conventional lands 110($a$-$n$) may protrude a significant distance beyond the boundary 120 of the conventional QFN package 130 such that the second portion 115$b$ of the conventional lands 110($a$-$n$) may be sawed and/or sheared when the conventional QFN package configuration 100 is removed from the PCB panel (not shown). After the second portion 115$b$ of the conventional lands 110($a$-$n$) have been sawed and/or sheared through when the conventional QFN package configuration 100 is removed from the PCB panel, sheared portions of the QFN package configuration 100 are not replated. The exposed metal lead frames included in the conventional PCB 140 then begin to oxidize and fail to wet when solder and heat are applied to the exposed metal lead frames. In doing so, the further that the second portion 115$b$ of the conventional lands 110($a$-$n$) protrude beyond the boundary 120 of the conventional QFN package 130, a greater surface area of the conventional lands 10($a$-$n$) are wet, but as the solder cools a solder joint between the conventional QFN package 130 and the conventional PCB 140 fails to form. Rather, a useless solder ball firms outside of the boundary 120 of the conventional QFN package 130 and generates flux residue that may trigger an increased opportunity of current leakage.

Figure 2:
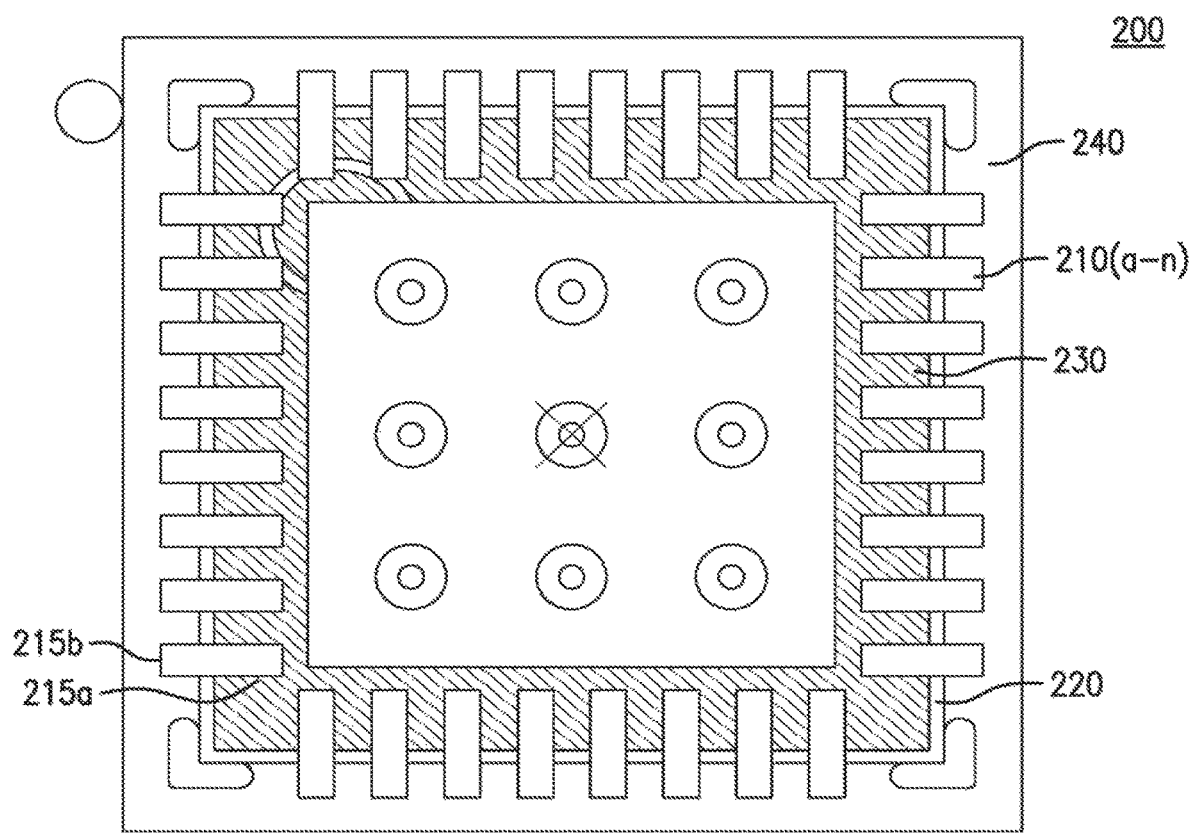
FIG. 2 is a top-elevational view of a conventional QFN package configuration based on the IPC-7351 standard that incorporates rectangular lands.

FIG. 2 illustrates a top-elevational view of a conventional QFN package configuration 200 based on the IPC-7351 standard that incorporates rectangular lands. The conventional QFN package configuration 200 includes a plurality of conventional rectangular lands 210($a$-$n$), where n is an integer equal to or greater than one, and is based on the dimensions of the conventional QFN package that the user requests and the requirements provided under the IPC-7351 standard.

Rather than being rounded, each of the conventional rectangular lands 210($a$-$n$) are rectangular shaped and are a single structure in that each of the conventional rectangular lands 210($a$-$n$) simply include the rectangular shaped structure that protrude under the conventional QFN package 230 as well as beyond the boundary 220 of the conventional QFN package 230. For example, the conventional rectangular land 210$a$ includes a first portion 215$a$ that protrudes under the conventional QFN package 230 as well as the second portion 215$b$ that protrudes well beyond the boundary 220 of the conventional QFN package 230. However, both the first portion 215$a$ and the second portion 215$b$ are part of the same conventional rectangular land 215$a$ with simply the first portion 215$a$ positioned under the conventional QFN package 230 and the second portion 215$b$ protruding well beyond the boundary 220 of the conventional QFN package 230. The conventional rectangular lands 210($a$-$n$) have similar issues regarding excess flux residue as discussed above regarding the conventional lands 210($a$-$n$).

Further, the solder when applied to the conventional rectangular lands 210($a$-$n$) to electrically connect the conventional QFN package 230 to the conventional PCB 240 coalesces back into a ball when the solder cools thereby generating rounded solder joints. However, the conventional rectangular lands 210($a$-$n$) are not circular but are rather rectangular. Thus, the elliptical shaped solder joint that is formed fails to match the rectangular shape of the conventional rectangular lands 210($a$-$n$) thereby does not adequately attach the conventional rectangular lands 210($a$-$n$) to the corresponding terminal (not shown) of the conventional QFN package 230. Rather, a useless rounded solder ball forms outside of the boundary 220 of the conventional QFN package 230 and generates flux residue that may trigger an increased opportunity of current leakage.

Figure 3:
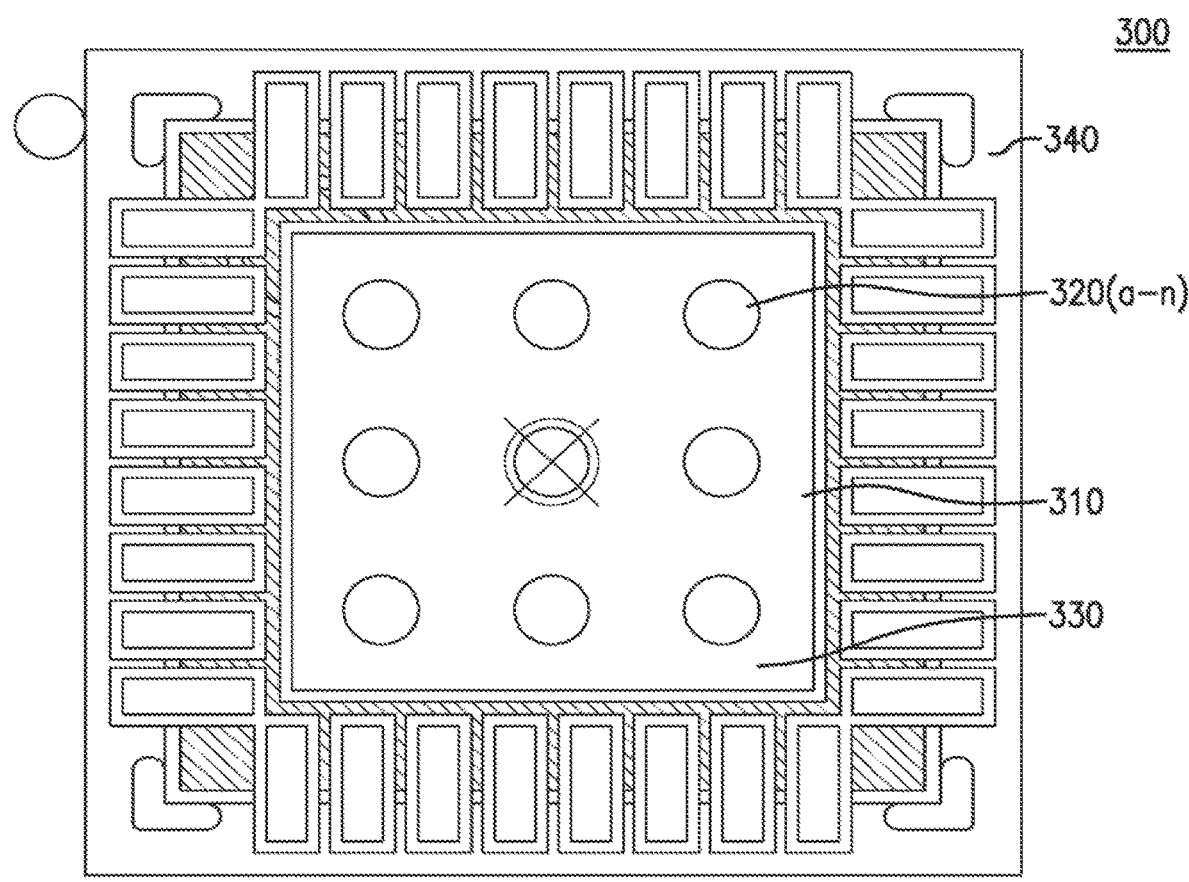
FIG. 3 is a top-elevational view of a conventional QFN package that portrays a conventional via in pad plated over (VIPPO) configuration.

FIG. 3 illustrates a top-elevational view of a conventional QFN package 300 that portrays a conventional via in pad plated over (VIPPO) configuration. The conventional QFN package 300 includes a thermal pad 310 that has a plurality of vias 320($a$-$n$), where n is an integer equal to or greater than one. The plurality of vias 320($a$-$n$) is then plated over to fill the vias 320($a$-$n$) via the conventional VIPPO configuration. However, on a top surface 330 of the thermal pad 310 that is opposite a bottom surface of the thermal pad 310 that is coupled to a conventional 340 PCB, air is trapped between each via 320($a$-$n$) at the top surface 330 of the thermal pad 310 and the screen print paste that is placed on the conventional QFN package 300 in plating over each of the vias 320($a$-$n$) via the conventional VIPPO configuration.

In doing so, a divot is created on the top surface 330 of the thermal pad 310 at each of the vias 320(*a-n*) from the air that is trapped between the screen print paste and the vias 320(*a-n*) via the conventional VIPPO configuration. Each of the divots created in the top surface 330 of the thermal pad 310 is not substantially planar causing issues fir the conventional QFN package 300.

Figure 4:
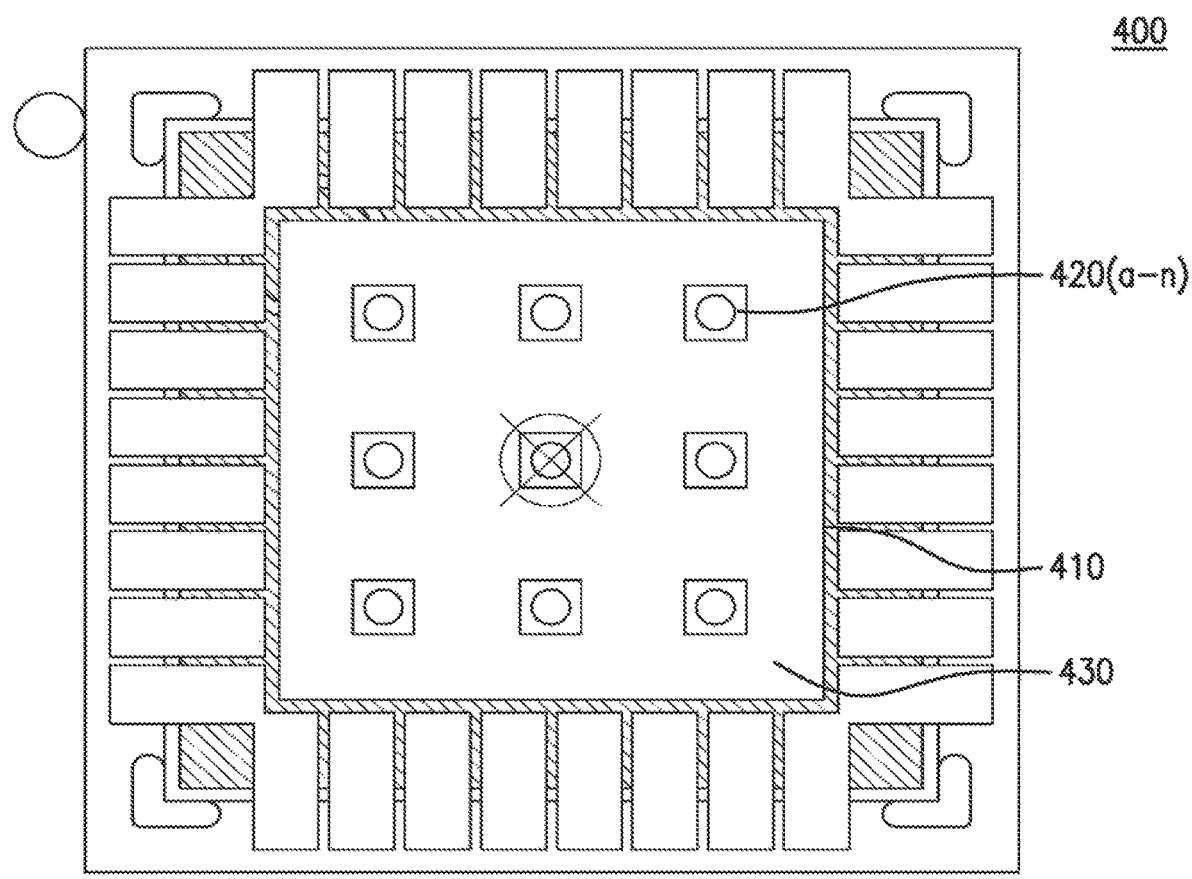
FIG. 4 is a top-elevational view of a conventional QFN package that portrays a conventional VIPPO configuration where strips of solder applied in each of the vias to connect the vias to the solder mask that is applied to the conventional QFN package.

FIG. 4 illustrates a top-elevational view of a conventional QFN package 400 that portrays a conventional VIPPO configuration where strips of solder applied in each of the vias to connect the vias to the solder mask that is applied to the conventional QFN package 400. The conventional QFN package 400 includes a thermal pad 410 that has a plurality of vias 420(*a-n*), where n is an integer value equal to or greater than one. The plurality of vias is then plated over with a solder mask to fill the vias 420(*a-n*) via the conventional VIPPO configuration. In addition to the solder mask being applied via the conventional VIPPO configuration, strips of solder are positioned in each of the vias 420(*a-n*) to attach each of the strips of solder to the solder mask applied at the top surface 430 of the thermal pad 410 to prevent the solder mask from peeling off the top surface 430 of the thermal pad 410 at each of the vias 420(*a-n*). However, in placing strips of solder into each of the vias 420(*a-n*) to attach each of the strips of solder to the solder mask that is applied to the top surface 430 of the thermal pad 410, voids are generated in each of the vias 420(*a-n*). Voids prevent the gas generated from the flux inside each of the vias 420(*a-n*) from escaping which in turn generates flux residue that may trigger an increased opportunity of current leakage.

Figure 5:
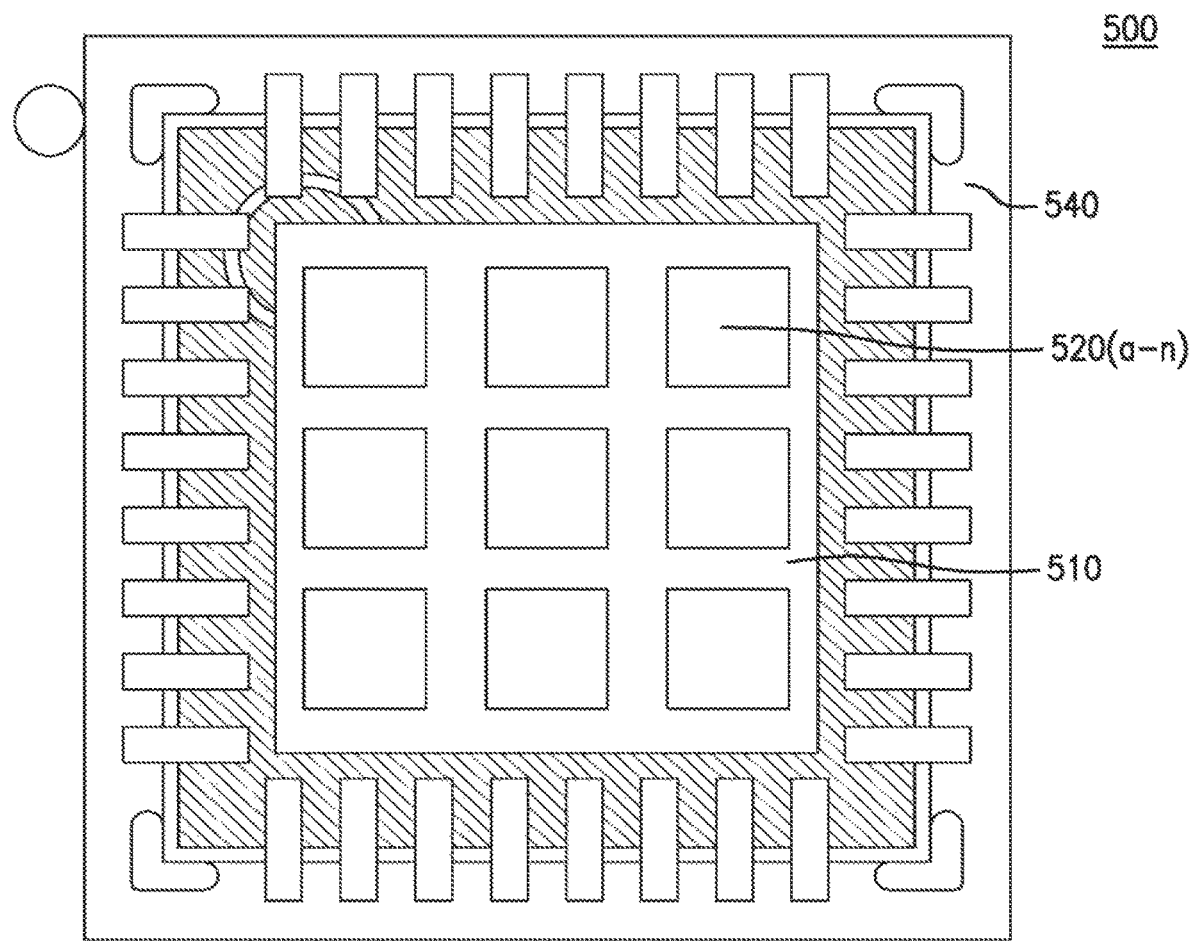
FIG. 5 is a top-elevational view of a conventional QFN package configuration that portrays a conventional window-pane paste that is applied to the thermal land where the thermal pad is electrically connected to the thermal land positioned on the conventional PCB.

FIG. 5 illustrates a top-elevational view of a conventional QFN package configuration 500 that portrays a conventional windowpane paste that is applied to the thermal land where the thermal pad is electrically connected to the thermal land positioned on the conventional PCB. The conventional QFN package configuration 500 includes a conventional thermal land 510 is positioned on top surface the conventional PCB 540 which is where the bottom surface of the thermal pad is electrically connected to the conventional thermal land 510 of the conventional PCB 540. The conventional thermal land 510 includes a plurality of solder areas 520(*a-n*) where solder is applied to electrically connect the thermal pad to the conventional thermal land 510 of the conventional PCB 540. However, insufficient heat is able to reach the solder to generate sufficient flux for the flux to coalesce at each of the solder areas 520(*a-n*) to adequately electrically connect the thermal pad to the conventional thermal land 510.

Thus, BTC packages best perform when excess flux is able to be purged from the BTC package when the BTC package is mounted to the PCB in order to remove any flux residue that may remain from the excess flux. As noted above, the excess flux residue may increase the likelihood of electro-chemical migration, dendritic growth, and/or corrosion and thus providing an increased opportunity of current leakage thereby unnecessarily draining the battery life of the battery source of the system that the BTC package is associated. Specifically, BTC packages have an increase in performance when uneven solder joint variation is limited thus resulting in the BTC package being substantially planar relative to the PCB. BTC packages also have an increase in performance when voiding is avoided in the thermal pad, robust solder joints are generated to withstand shock, an acceptably high SIR to limit the current leakage of the BTC package, and the BTC package is encapsulated from the environment.

Bottom termination components (BTC) are surface-mounted ICs that have contacts shifted to the bottom surface of the package. For example, BTCs include but are not limited to quad-flat no-leads (QFN) packages and dual-flat no-leads (DFN) packages where the IC packages are surface mounted to printed circuit boards (PCB) and electrically connected to the PCBs via lands positioned along the perimeter of the package and along the bottom surface of the package. Other examples of BTCs include but are not limited to quad-flat packages and ball grid arrays (BGA).

Approaches to Reduce Flux Residue of a BTC Package

FIG. 6 illustrates a top-elevational view of a BTC package configuration 600 that reduces flux residue of the BTC package according to an exemplary embodiment of the present disclosure. The BTC package configuration 600 includes a plurality of vias 620(*a-n*), where n is an integer equal to or greater than one. The vias 620(*a-n*) provide an electrical connection between the layers of the BTC package configuration 600 where the vias 620(*a-n*) pass through the adjacent layers of the BTC package configuration 600.

In an embodiment, each of the vias 620(*a-n*) may be positioned in a staggered row and column formation such that each row of vias 620(*a-n*) is not aligned with each immediate adjacent row of vias 620(*a-n*) and each column of vias is not aligned with each immediate adjacent column of vias. For example, the row of vias 620*a*, 620*b*, and 620*c* are not aligned with the adjacent row of vias 620*d* and 620*e*. Further the column of vias including 620*a* is not aligned with the adjacent column of vias including 620*d*. In an embodiment, each of the vias 620(*a-n*) may be positioned in a uniform matrix such that each row of vias 620(*a-n*) is aligned with each immediate adjacent row of vias 620(*a-n*) and each column of vias is aligned with each immediate adjacent column of vias. For example, the row of vias 620*a*, 620*b*, and 620*c* are aligned with the adjacent row of vias 620*d* and 620*e*. Further the column of vias including 620*a* is aligned with the adjacent column of vias including 620*d*.

The vias 620(*a-n*) may remove flux generated from solder applied to the BTC package configuration 600 as the BTC package 630 is mounted to the PCB 640. Each of the vias 620(*a-n*) may extend from a first surface 650 of a thermal pad 660 of the BTC package 630 where the first surface 650 is the top surface of the thermal pad 660 and extend through the thermal pad 660 to a second surface (not shown) of the thermal pad 660 that is mounted to the PCB 640 where the second surface is the bottom surface of the thermal pad 660 opposite the first surface 650 of the thermal pad 660. The vias 620(*a-n*) may purge flux from the first surface 650 of the thermal pad 660 and from between a plurality of lands 610(*a-n*), where n is an integer equal to or greater than one as the flux is generated from the solder applied to the BTC package configuration 600. The flux may be pushed through the vias 620(*a-n*) from the second surface of the thermal pad 660 out onto a bottom surface (not shown) of the PCB 640 that is positioned opposite a top surface 670 of the PCB 640 that the BTC package 630 is mounted so that the flux is removed from between the thermal pad 660 and the PCB 640 and from between the lands 610(*a-n*).

As the solder paste is printed on the BTC package configuration 600, the solder paste covers the BTC package configuration 600 and some of the solder may wick into the vias 620(*a-n*). The solder may then be heated and flux in the solder may be generated as the solder begins to boil as the solder transfers from a liquid state to a gas state. The generated flux may then escape from the metal positioned in the PCB 640 and coalesce into a spherical shaped balls of solder where the spherical shaped balls push out the flux. The vias 620(*a-n*) positioned in the thermal pad 660 that extend down through PCB 640 and onto the bottom surface of the PCB 640 may enable the flux that accumulates to be blown out of the bottom surface of the PCB 640 such that the flux is purged out of the bottom surface of the PCB 640. Even after the flux begins to cool and transitions from the gas state to a liquid state, the liquid flux may continue to run out of the bottom surface of the PCB 640 from the vias 620(*a-n*) such that any flux residue is removed from between the thermal pad 660 and the PCB 640 as well as from between the lands 610(*a-n*).

The wetting process of soldering may take an activated solderable surface such as but not limited to copper, tin, and/or gold such that the solder may crawl along the activated solderable surface due to the wetted solder is attracted to the metals included in the activated solderable surface. The solder itself may push the liquid flux down through the vias 620(*a-n*) and out of the bottom surface of the PCB 640. Any remaining flux that is present on the bottom surface of the PCB 640 may then be exposed to heat during the reflow process and may be dried such that the remaining dried flux residue positioned on the bottom surface of the PCB 640 may have little risk of transitioning into dendritic growth and/or corrosion and thus providing an increased opportunity of current leakage thereby unnecessarily draining the battery life of the battery source of the system that the BTC package is associated. Thus, the vias 620(*a-n*) may allow flux to purge out of the bottom surface of the PCB 640 such that the flux is removed from between the thermal pad 660 and the PCB 640 as well as from the between the lands 610(*a-n*).

In an embodiment, the quantity of vias 620(*a-n*) as well as the diameter of each of the vias 620(*a-n*) may be selected such that an excess volume of flux that is generated from the solder that is applied to the BTC package configuration 600 is prevented from purging through the vias 620(*a-n*). In doing so, a solder bond with an adequate thickness may be generated to attach the BTC 630 to the PCB 640 while maintaining adequate spacing between the BTC 630 and the PCB 640 via the solder bond to allow flux to be flushed out from between the BTC 630 and the PCB 640.

As mentioned above, the vias 620(*a-n*) enable the flux to be pulled through the vias 620(*a-n*) and purged out through the bottom surface of the PCB 640. However, purging the flux at an increased volume may result in the BTC 630 being pulled so close to the PCB 640 that the spacing between the BTC 630 and the PCB 640 is insufficient for the flux to be flushed out from between the BTC 630 and the PCB 640. Further, having a quantity of vias 620(*a-n*) as well as the diameter of each of the vias 620(*a-n*) that may result in an insufficient amount of flux that is generated from the solder that is applied to the BTC package 600 that is removed from the between the BTC 630 and the PCB 640 as well as from between the lands 610(*a-n*). In doing so, significant flux residue may remain thereby increasing the risk of transitioning into dendritic growth and/or corrosion and thus providing an increased opportunity of current leakage thereby unnecessarily draining the battery life of the battery source of the system that the BTC package is associated.

Further, having a diameter of each of the vias 620(*a-n*) that requires an increased quantity of vias 620(*a-n*) to be added to the thermal pad 660 in order to adequately purge the flux through the vias 620(*a-n*) to remove the flux from between the BTC 630 and the PCB 640 as well as from between the lands 610(*a-n*) may unnecessarily increase the drill wear of the BTC package configuration 600 as well as unnecessarily increase the drill time to manufacturing the BTC package configuration 600 as well as increasing the drill wear-out of the BTC package configuration 600 thereby decreasing the yield of the BTC package configuration 600 and increasing the cost.

Thus, an optimal quantity of vias 620(*a-n*) included in the thermal pad 660 with each via 620(*a-n*) having an optimal diameter may enable an adequate amount of flux to be purged through the vias 620(*a-n*) to remove the flux from between the BTC 630 and the PCB 640 and from between the lands 610(*a-n*). However, the optimal quantity of vias 620(*a-n*) with each via 620(*a-n*) having an optimal diameter may also prevent the excess volume of flux from being purged through the vias 620(*a-n*) that reduces the spacing between the BTC 630 and the PCB 640 thereby preventing the flux from being flushed out between the BTC 630 and the PCB 640.

In an embodiment, a thickness of the solder bond to adequately electrically connect the BCT 630 to the PCB 640 while maintaining adequate spacing between the BTC 630 and the PCB 640 to enable flux to be sufficiently flushed out between the BTC 630 and the PCB 640 is between 25 and 75 microns. In an embodiment, the quantity of vias 620(*a-n*) as well as the diameter of the vias 620(*a-n*) may be selected such that an average of 1.39 vias per square millimeter be positioned on the thermal pad 660 to enable flux to be sufficiently purged from the vias 620(*a-n*) while maintaining the spacing between the BTC 630 and the PCB 640 to enable flux to be sufficiently flushed out between the BTC 630 and the PCB 640. In an embodiment, the average of vias per square millimeter positioned on the thermal pad 660 may be selected from range of 1.38 vias per square millimeter to 1.43 vias per square millimeter. In an embodiment, the diameter of the vias 620(*a-n*) may be selected such that each diameter is 200 microns to enable flux to be sufficiently purged from the vias 620(*a-n*) while maintaining the spacing between the BTC 630 and the PCB 640 to enable flux to be sufficiently flushed out between the BTC 630 and the PCB 640. In another embodiment, the diameter of the vias 620(*a-n*) may be selected from a range of diameters that range from 180 microns to 250 microns.

In an embodiment, the BTC 630 is mounted to the PCB 640 and is electrically connected to the BTC 630 via the lands 610(*a-n*) and receives the heat transfer from the BTC 630 via the thermal pad 660 and includes at least one reservoir 680(*a-n*), where n is an integer equal to or greater than one. The reservoirs 680(*a-n*) may pull flux positioned between the lands 610(*a-n*) into the reservoirs 680(*a-n*) as the flux is generated from the solder applied to the BTC package configuration 600 as the BTC 630 is mounted to the PCB 640. The reservoirs 680(*a-n*) may be openings in the solder mask 690 that is applied to the BTC package configuration 600 such that the reservoirs may pull the flux positioned between the lands 610(*a-n*) into the opening in the solder mask 690 that is associated with the reservoirs 680(*a-n*) as the flux transitions into a liquid.

Each of the reservoirs 680(*a-n*) may be shaped as an elliptical pattern in the opening of the solder mask 690 such that the reservoirs pull the flux positioned between the lands 610(*a-n*) into the elliptical pattern in the opening of the solder mask 690 as the flux transforms into a spherical shape based on a capillary action as the flux transitions into the liquid. The elliptical pattern is a pattern that is a curved shape in in the opening of the solder mask 690. As reservoirs 680(*a-n*) widen into the elliptical pattern and extend from the BTC 630, a capillary action occurs and the flux transitions into the gas state and begins to blow out each of the corners of the BTC 630 as well as in between the lands 610(*a-n*). As the flux transitions back from the gas state into the liquid state, the flux pulls up into the elliptical shaped reservoirs 680(*a-n*). In doing so, the flux is pulled from between the lands 610(*a-n*) into each of the elliptical shaped reservoirs 680(*a-n*) positioned at each of the four corners of the BTC 630.

Once the flux is pulled into the reservoirs 680(*a-n*), the flux is exposed to heat and evaporates and any flux residue that remains may be dried such that the flux residue does not have a risk of transitioning into dendritic growth and/or corrosion and thus providing an increased opportunity of current leakage thereby unnecessarily draining the battery life of the battery source of the system that the BTC package is associated. Further, each of the reservoirs 680(*a-n*) shaped as the elliptical pattern may be positioned between a ground land and a power land to prevent current leakage between the current land and the ground land. Any flux residue that is trapped between a power land and a ground land may result in an ideal path to have dendrites and/or corrosion grow resulting in an increased risk of current leakage. Thus, the positioning of the reservoirs 680(*a-n*) between the current land and the ground land may decrease the risk of current leakage.

In an embodiment, each of the lands 610(*a-n*) include a peripheral terminal 615(*a-n*) that is electrically connected to a corresponding terminal (not shown) associated with the BTC 630 and a trace 625(*a-n*) that extends from the corresponding peripheral terminal 615(*a-n*). The trace 625(*a-n*) also extends beyond a solder mask 690 that is applied to the BTC package configuration 600. Each trace 625(*a-n*) includes a width that is less than a width of each corresponding peripheral terminal and may prevent the BTC 630 from tilting as the BTC 630 is mounted to the PCB 640.

Each of the peripheral terminals 615 (*a-n*) may have a substantially similar surface area and each of the traces 625(*a-n*) that extend from the corresponding peripheral terminals 615(*a-n*) may also have a substantially similar surface area. The solder deposits that are positioned between each land 610(*a-n*) and each corresponding terminal of the BTC 630 may also include a substantially equal volume of solder. Since each of the peripheral terminals 615(*a-n*) have substantially similar surface areas and each of the traces 625(*a-n*) have substantially similar surface areas and the solder deposits have substantially equal volumes of solder, the solder deposits of substantially equal volumes may conform to the substantially similar surface area of each corresponding peripheral terminal 615(*a-n*) and the substantially similar surface area of each corresponding trace 625(*a-n*).

Each of the solder deposits of substantially equal volume that are positioned between each corresponding land 610(*a-n*) and each corresponding terminal of the BTC 630 may ensure that the BTC 630 is mounted to the PCB 640 such that the BTC 630 is substantially planar relative to the PCB 640. In doing so, the substantially equal volume of each solder deposit conforms to the substantially similar surface area of each corresponding peripheral terminal 615(*a-n*) and each corresponding trace 625(*a-n*) thereby pulling the BTC 630 to be substantially planar to the PCB 640 when mounted to the PCB 640.

Often times different conventional devices require that only a portion of conventional lands have solder deposits positioned between the portion of conventional lands and corresponding terminals of the conventional device. However, if the remaining conventional lands that do not require being soldered to the corresponding terminals are indeed not connected via solder deposits of substantially equal volume, then the conventional device may tilt such that the conventional device is not planar to the conventional PCB when mounted to the conventional PCB. The conventional device that is tilted may have open solder joints along the portion of the conventional device that has tilted up such a distance from the surface of the PCB that the solder joints are unable to electrically connect the conventional lands with the corresponding terminals of the conventional device.

Further, the conventional device that is tilted may have short circuits and/or near short circuits between the conventional lands and the corresponding terminals of the conventional device that are positioned on the conventional device that has pivoted due to the tilt of the conventional device such that the conventional lands and the corresponding terminals are directly touching due to the solder joints being crushed among the pivot thereby causing a short circuit and/or near short circuit. Thus, the positioning of solder deposits of substantially equal volume between each peripheral terminal 615(*a-n*) and each trace 625(*a-n*) of substantially surface area and each corresponding terminal of the BTC 630 may ensure that the BTC 630 is mounted to the PCB 640 in a substantially planar manner.

In an embodiment, the traces 625(*a-n*) provide a route from each of the corresponding peripheral terminals 615(*a-n*) with each of the traces 625(*a-n*) having a surface area that is less than the peripheral terminals 625(*a-n*). The traces 625(*a-n*) extend outward from the BTC 630 in a fan-out pattern and is defined by the solder mask 690 where each of the traces 625(*a-n*) terminate in the solderable area of each land 610(*a-n*) out on the corresponding traces 625(*a-n*). The terminals molded on the bottom surface of the BTC 630 may have a substantially similar shape and surface area as each corresponding peripheral terminal 625(*a-n*).

Figure 7:
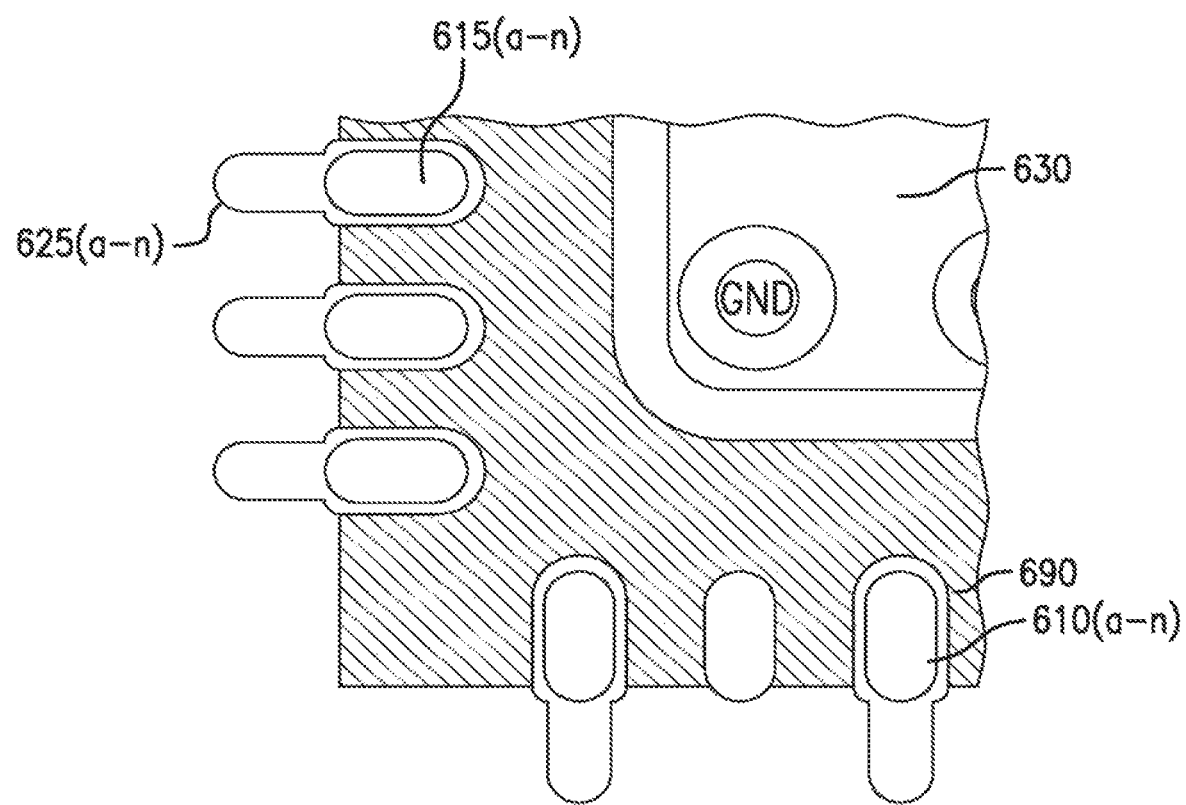
FIG. 7 is a top-elevational view of an example BTC package configuration that depicts an example of the lands that have the trace and the peripheral terminal configuration according to an exemplary embodiment of the present disclosure.

FIG. 7 illustrates a top-elevational view of an example BTC package configuration 700 that depicts an example of the lands that have the trace and the peripheral terminal configuration. As shown in FIG. 7 each of the lands 610(*a-n*) include the corresponding peripheral terminal 615(*a-n*) and the corresponding trace 625(*a-n*). Example dimensions of the peripheral terminals 615(*a-n*) include the dimensions of 0.3 mm and 0.5 mm. In an embodiment, the dimensions of the peripheral terminals 615(*a-n*) may be in a 1×1 relationship with the BTC package configuration 700 such that each of the peripheral terminals 615(*a-n*) have substantially similar surface areas relative to the BTC package configuration 700. Example dimensions of the traces 625(*a-n*) extend 0.2 mm and fan out from the BTC 630. In such an example, the 0.2 mm may be sufficiently long for the traces 625(*a-n*) to extend beyond the solder mask 690 while not extending a significantly increased distance from the solder mask 690 such that the traces 625(*a-n*) may be sawn and remain unplated resulting in an unformed solder ball that fails to join anything together.

In an embodiment, lands 610(*a-n*) may be rounded as opposed to be rectangular lands. Solder stencils with rectangular apertures correspond to square corners of the rectangular lands. However, using square or rectangular corners in stencils may not be best practice for printing as sharp corners tend to collect solder deposits as compared to stencils that have rounded corners. Further, solder does not naturally form square and/or rectangular joints and may coalesce into the solder joint leaving thin and/or uncoated areas at the sharp land corners.

In an embodiment, VIPPO thermal vias may be avoided to avoid air being trapped between the via and the solder mask resulting in a divot at the surface of the via and the BTC. Solder strips electrically connecting the vias to the solder mask may also be avoided to avoid defined voids from forming. In an embodiment, a no-clean solder process that mitigates flux residues while obtaining low thermal voiding and adequate solder joints may be obtained by determining the quantity and size of the vias, incorporating encroached vias on the non-device side, incorporating reservoirs, incorporating uniform land size for peripheral terminals, incorporating rounded D-lands with trace fan-outs, incorporating gang solder mask relief, incorporating 75 microns form joint toe area, eliminating conductor traces from terminals to thermal lands, incorporating a 125 micron thick stencil with polished nanocoated apertures, and incorporating 90% paste area on the thermal paddle land and 50% paste area on the peripheral lands.

Figure 8:
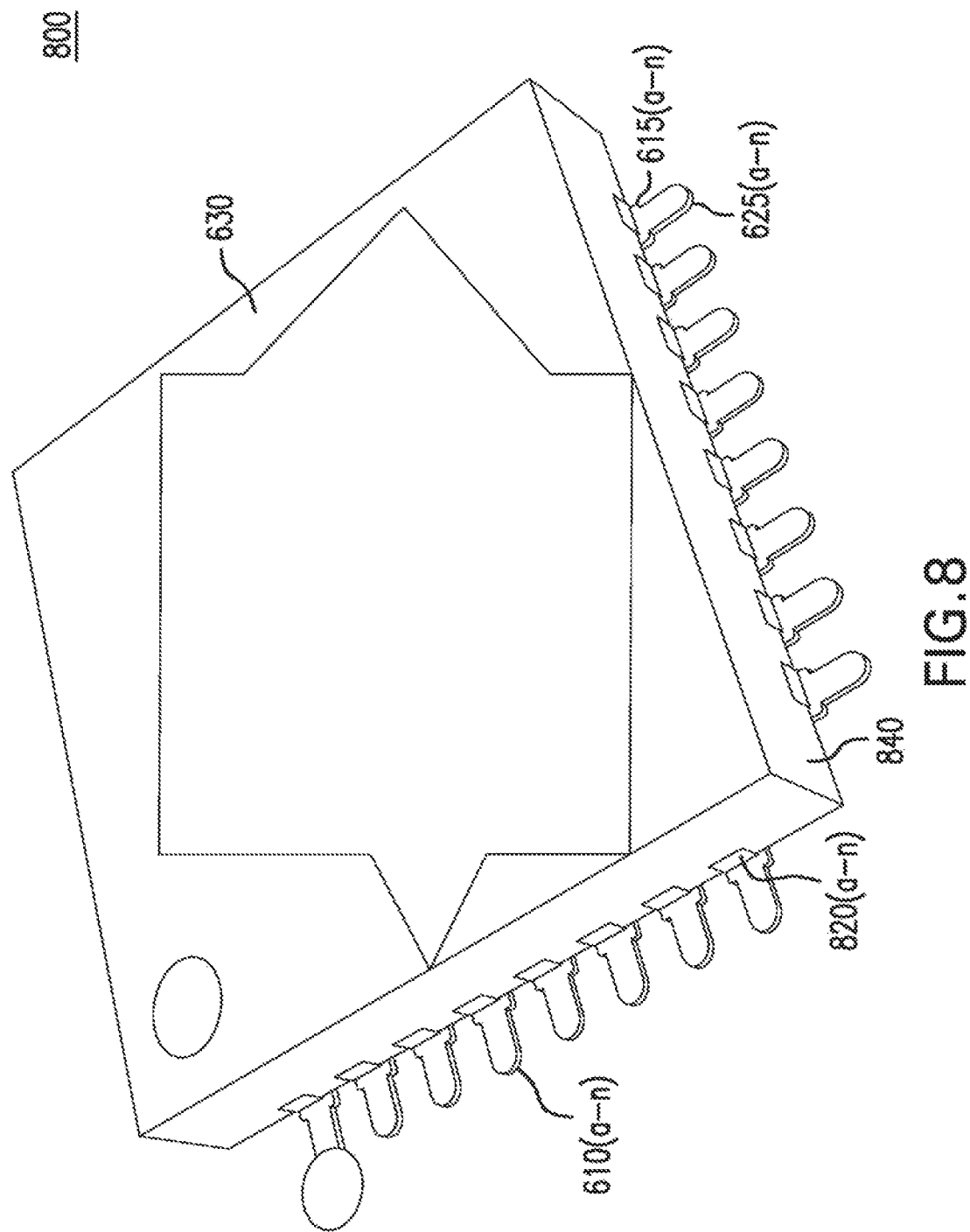
FIG. 8 is a block diagram of another exemplary BTC package configuration and provides a three-dimensional view of the exemplary BTC package configuration depicted in FIG. 6 according to an exemplary embodiment of the present disclosure.

FIG. 8 is a block diagram of another exemplary BTC package configuration 800 and provides a three-dimensional view of the exemplary BTC package configuration 600 depicted in FIG. 6 according to an exemplary embodiment of the present disclosure. Specifically, FIG. 8 depicts a three-dimensional view of the BTC package 630 after the BTC package 630 has been mounted to the PCB. A plurality of terminals 820(*a-n*), where n is an integer equal to or greater than one, is positioned on a bottom surface 840 of the BTC package 630 and are positioned under the BTC package 630. Each of the lands 610(*a-n*) is electrically connected to each of the corresponding terminals 820(*a-n*) such that each of the peripheral terminals 615(*a-n*) are mounted to each of the corresponding terminals 820(*a-n*) and then each of the traces 625(*a-n*) extend outward from the BTC package 630 in a fan-out configuration.

FIG. 9 is a block diagram of another exemplary BTC package configuration 900 and provides a three-dimensional view of the exemplary BTC package configuration 600 depicted in FIG. 6 according to an exemplary embodiment of the present disclosure. Specifically, FIG. 9 depicts a three-dimensional view of the BTC package 630 after the BTC package 630 has been mounted to the PCB 640. A plurality of terminals 820(*a-n*), where n is an integer equal to or greater than one, is positioned on a bottom surface 840 of the BTC package 630 and are positioned under the BTC package 630. Each of the lands 610(*a-n*) is electrically connected to each of the corresponding terminals 820(*a-n*) such that each of the peripheral terminals 615(*a-n*) are mounted to each of the corresponding terminals 820(*a-n*) and then each of the traces 625(*a-n*) extend outward from the BTC package 630 in a fan-out configuration.

Further, a plurality of openings 960(*a-n*) is positioned on the bottom surface 950 of the PCB 640. The bottom surface 840 of the BTC package 630 may be mounted to the top surface of the PCB 640 and the bottom surface 950 of the PCB 640 may include the openings 960(*a-n*). Each of the openings 960(*a-n*) may be coupled to each of the vias 620(*a-n*) such that as the flux is purged through the vias 620(*a-n*) from between the BTC package 630 and the PCB 640 as well as from between the lands 610(*a-n*), the flux is pushed out of the vias 620(*a-n*) and through the PCB 640 and out from the bottom surface of the 950 of the PCB 640 via the openings 960(*a-n*). Any remaining flux residue that is present at the openings 960(*a-n*) may be baked and hardened such that the remaining flux residue has no negative impact on the BTC package configuration 900.

FIG. 10 is a block diagram of an exemplary access device configuration 1000 that incorporates the BTC package configurations discussed in detail above. For example, the access device configuration 1000 may incorporate the BTC package configuration 600 into the BTC package configuration 1020 which operates as the controller for the access control device. In doing so the, BTC package configuration 1020 as operating as the controller of the access control device 1010 may control one or more components of the access control device 1010 as the access control device 1010 operates. For example, the access control device 1010 may be a locking system and the BTC package configuration 1020 may determine when the door latch of the locking mechanism included in the access control device 1010 is to extend when the access control device 1010 is to be locked and when the door latch is to retract when the access control device 1010 is to be unlocked.

The access control device 1010 that the BTC package configuration 1020 may act as the controller for may include but is not limited to door closers, door operators, auto-operators, credential readers, hotspot readers, electronic locks including mortise, cylindrical, and/or tabular locks, exit devices, panic bars, wireless reader interfaces, gateway devices, plug-in devices, peripheral devices, doorbell camera systems, access control surveillance systems and/or any other type of access control device that regulates access to a space that will be apparent to those skilled in the relevant art(s) without departing from the spirit and scope of the disclosure.

The BTC package configuration 1020 when operating as the controller for the access control device 1010 may control one or more components of the access control device 1010 as the access control device 1010 operates such as but not limited to, extending/retracting a door latch, engaging/disengaging a dogging mechanism on an exit device, opening/closing a door via a door closer/operator, moving a primer mover, controlling an electric motor, and/or any other type of action that enables the access control device 1010 to regulate access to a space that will be apparent to those skilled in the relevant art(s) without departing from the spirit and scope of the disclosure.

The BTC package configuration 1020 when operating as the controller for the access control device 1010 may receive data from the access control device 1010 as well any type of component included in the access control device 1010 that may provide data to the BTC configuration 1020 for the BTC package configuration 1020 to adequately instruct the access control device 1010 as to how to operate to adequately regulate access to the space.

For example, sensors included in a locking mechanism may send data to the BTC package configuration 1020 indicating that a person has departed from the door after the door closed behind the person. The BTC package configuration 1020 may then instruct the door latch to extend thereby locking the door. The BTC package configuration 1020 may receive data from any type of component included in the access control device 1010 that includes but is not limited to sensors, credential readers, biometric sensing devices, user interface devices, and/or any other component that may provide data to the BTC package configuration 1020 to adequately instruct the access control device 1010 to execute actions to regulate access to the space that will be apparent to those skilled in the relevant art(s) without departing from the spirit and scope of the disclosure.

The BTC package configuration 1020 may communicate to with the access control device 1010 via wire-line communication and/or wireless communication. The BTC package configuration 1020 may engage in wireless communication with the access control device 1300 that includes but is not limited to Bluetooth, BLE, Wi-Fi, and/or any other wireless communication protocol that will be apparent to those skilled in the relevant art(s) without departing from the spirit and scope of the disclosure.

CONCLUSION

It is to be appreciated that the Detailed Description section, and not the Abstract section, is intended to be used to interpret the claims. The Abstract section may set forth one or more, but not all exemplary embodiments, of the present disclosure, and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) the various changes in form and detail can be made without departing from the sprit and scope of the present disclosure. Thus the present disclosure should not be limited by any of the above-described exemplary embodiments, but should be defined only in accordance with the following claims and their equivalents.

What is claimed is:

1. A method for removing flux generated from solder applied to a surface-mounted integrated circuit (IC) as the surface-mounted IC is assembled, the method comprising:
   mounting at least one bottom termination component (BTC) having a plurality of lands and a thermal pad to a printed circuit board (PCB) having at least one reservoir;
   providing an electrical connection between the BTC and the PCB via the plurality of lands;
   providing heat transfer from the BTC to the PCB via the thermal pad, wherein the thermal pad includes a plurality of vias;
   removing flux generated from the solder applied to the surface-mounted IC as the surface-mounted IC is assembled via the plurality of vias included in the thermal pad; and
   pulling flux positioned between the plurality of lands into the at least one reservoir as the flux is generated from the solder applied to the surface-mounted IC as the surface-mounted IC is assembled.

2. The method of claim 1, wherein the removing of flux via the plurality of vias comprises:
   purging flux from a first surface of the thermal pad and from between the plurality of lands via the plurality of vias, wherein the plurality of vias extend from the first surface of the thermal pad through the thermal pad and to a second surface of the thermal pad opposite the first surface and is mounted to the PCB; and
   pushing the flux through the plurality of vias and from the second surface of the thermal pad out onto a bottom surface of the PCB that is positioned opposite a top surface of the PCB that the BTC is mounted so that the flux is removed from between the thermal pad and the PCB and from between the plurality of lands.

3. The method of claim 2, wherein the removing of flux via the plurality of vias further comprises:
   preventing an excess volume of flux generated from the solder applied to the surface-mounted IC from purging through the plurality of vias that reduces the spacing between the BTC and the PCB thereby preventing the flux from being flushed out from between the BTC and the PCB;
   maintaining a solder bond with a thickness that is sufficient to attach the BTC to the PCB;
   maintaining a spacing between the BTC and the PCB via the solder bond to allow flux to be flushed out from between the BTC and the PCB; and
   generating an optimal quantity of vias included in the thermal pad with each via having an optimal diameter that enables an adequate amount of flux to be purged through the plurality of vias to remove the flux from the first surface of the thermal pad and from between the plurality of lands and prevents the excess volume of flux from being purged through the plurality of vias.

4. The method of claim 1, wherein the removing of flux via the plurality of vias further comprises:
   positioning in a uniform matrix so that each row of vias is aligned with each immediate adjacent row of vias and each column of vias is aligned with each immediate adjacent column of vias.

5. The method of claim 1, wherein removing of flux via the plurality of vias further comprises:
   positioning in a staggered row and column formation so that each row of vias is not aligned with each immediate adjacent row of vias and each column of vias is not aligned with each immediate adjacent column of vias.

6. The method of claim 1, wherein the pulling of flux via the at least one reservoir comprises:
   pulling the flux positioned between the plurality of lands into an opening in a solder mask that is associated with the at least one reservoir as the flux transitions into a liquid, wherein the at least one reservoir is the opening in the solder mask that is applied to the surface-mounted IC package.

7. The method of claim 6, there pulling of flux via the at least one reservoir further comprises:
   pulling the flux positioned between the plurality of lands into an elliptical pattern in the opening of the solder mask as the flux is transformed into a spherical shape based on a capillary action of the flux as the flux transitions into the liquid, wherein the at least one reservoir is shaped as the elliptical pattern.

8. The method of claim 7, wherein the pulling of flux via the at least one reservoir further comprises:
   forming a plurality of reservoirs formed in the PCB with each reservoir shaped as the elliptical pattern and positioned between a ground land and a power land; and
   preventing current leakage between the ground land and the power land.

9. The method of claim 1, further comprising positioning the plurality of vias in a staggered row and column formation so that each row of vias is not aligned with each immediate adjacent row of vias and each column of vias is not aligned with each immediate column of vias.

10. A method for removing flux generated from solder applied to a surface-mounted integrated circuit (IC) as the surface-mounted IC is assembled, the method comprising:
    mounting at least one bottom termination component (BTC) having a plurality of lands and a thermal pad to a printed circuit board (PCB) having at least one reservoir;
    providing an electrical connection between the BTC and the PCB via the plurality of lands;

providing heat transfer from the BTC to the PCB via the thermal pad, wherein the thermal pad includes a plurality of vias;

positioning the plurality of vias in a staggered row and column formation so that each row of vias is not aligned with each immediate adjacent row of vias and each column of vias is not aligned with each immediate column of vias; and removing flux generated from the solder applied to the surface-mounted IC as the surface-mounted IC is assembled via the plurality of vias included in the thermal pad.

11. The method of claim 10, further comprising pulling flux positioned between the plurality of lands into the at least one reservoir.

12. The method of claim 11, wherein the pulling of flux into the at least one reservoir comprises:

pulling the flux positioned between the plurality of lands into an opening in a solder mask that is associated with the at least one reservoir as the flux transitions into a liquid, wherein the at least one reservoir is the opening in the solder mask that is applied to the surface-mounted IC package.

13. The method of claim 11, wherein the pulling of flux into the at least one reservoir comprises:

pulling the flux positioned between the plurality of lands into an elliptical pattern in an opening of a solder mask as the flux is transformed into a spherical shape based on a capillary action of the flux as the flux transitions into a liquid, wherein the at least one reservoir is shaped as the elliptical pattern.

14. The method of claim 11, wherein the pulling of flux into the at least one reservoir comprises:

forming a plurality of the at least one reservoir in the PCB with each reservoir shaped as an elliptical pattern and positioned between a ground land and a power land; and preventing current leakage between the ground land and the power land.

15. The method of claim 10, wherein the removing of flux via the plurality of vias comprises:

purging flux from a first surface of the thermal pad and from between the plurality of lands via the plurality of vias, wherein the plurality of vias extend from the first surface of the thermal pad through the thermal pad and to a second surface of the thermal pad opposite the first surface and is mounted to the PCB; and pushing the flux through the plurality of vias and from the second surface of the thermal pad out onto a bottom surface of the PCB that is positioned opposite a top surface of the PCB that the BTC is mounted so that the flux is removed from between the thermal pad and the PCB and from between the plurality of lands.

16. The method of claim 15, wherein the removing of flux via the plurality of vias further comprises:

preventing an excess volume of flux generated from the solder applied to the surface-mounted IC from purging through the plurality of vias that reduces the spacing between the BTC and the PCB thereby preventing the flux from being flushed out from between the BTC and the PCB;

maintaining a solder bond with a thickness that is sufficient to attach the BTC to the PCB;

maintaining a spacing between the BTC and the PCB via the solder bond to allow flux to be flushed out from between the BTC and the PCB; and generating an optimal quantity of vias included in the thermal pad with each via having an optimal diameter that enables an adequate amount of flux to be purged through the plurality of vias to remove the flux from the first surface of the thermal pad and from between the plurality of lands and prevents the excess volume of flux from being purged through the plurality of vias.

17. A method for removing flux generated from solder applied to a surface-mounted integrated circuit (IC) package as the surface-mounted IC package is assembled, the method comprising:

mounting at least one bottom termination component (BTC) having a plurality of lands and a thermal pad to a printed circuit board (PCB);

providing heat transfer from the BTC to the PCB via the thermal pad, wherein the thermal pad includes a plurality of vias configured to remove flux generated from the solder applied to the surface-mounted IC package; and electrically connecting a peripheral terminal associated with each of the plurality of lands to a corresponding terminal associated with the BTC and a trace extending from the corresponding peripheral terminal and extending beyond a solder mask applied to the surface-mounted IC package; and wherein each trace is connected to a corresponding one of the peripheral terminal and is configured to prevent the BTC from tilting as the BTC is mounted to the PCB.

18. The method of claim 17, wherein each of the peripheral terminals of the plurality of lands have a substantially similar surface area, and wherein each of the traces that extend from the corresponding peripheral terminals have a substantially similar surface area.

19. The method of claim 18, further comprising positioning a plurality of solder deposits between each land of the plurality of lands and each corresponding terminal from the terminals associated with the BTC, and wherein each solder deposit includes a substantially equal volume of solder.

20. The method of claim 19, wherein each solder deposit of substantially equal volume conforms to the substantially similar surface area of each corresponding peripheral terminal and the substantially similar surface area of each corresponding trace.

* * * * *